United States Patent [19]
Lee

[11] Patent Number: 6,150,237
[45] Date of Patent: Nov. 21, 2000

[54] METHOD OF FABRICATING STI

[75] Inventor: Tong-Hsin Lee, Taipei Hsien, Taiwan

[73] Assignees: United Silicon Inc.; United Microelectronics Corp., both of Hsinchu, Taiwan

[21] Appl. No.: 09/420,049

[22] Filed: Oct. 18, 1999

[51] Int. Cl.[7] .................................................. H01L 21/76
[52] U.S. Cl. ........................................... 438/433; 438/435
[58] Field of Search .................................... 438/433–435, 438/218, 221, 424, 427

[56] References Cited

U.S. PATENT DOCUMENTS

| | | | |
|---|---|---|---|
| 5,616,513 | 4/1997 | Shepard | 438/433 |
| 5,643,822 | 7/1997 | Furukawa et al. | 438/421 |
| 5,963,819 | 10/1999 | Lan | 438/424 |

*Primary Examiner*—Olik Chaudhuri
*Assistant Examiner*—Anh Duy Mai
*Attorney, Agent, or Firm*—Charles C. H. Wu; Charles C. H. Wu & Associates

[57] ABSTRACT

A fabrication method for shallow trench isolation (STI) is briefly described as follows. A substrate is provided with a patterned mask layer and pad oxide layer formed thereon, so that a first opening, which exposes a part of the substrate, is formed. A shallow trench is then formed in the substrate, followed by filling the shallow trench with a first insulating layer, wherein the surface of the first insulating layer is lower than the surface of the substrate, and a part of the substrate forming the sidewall of the shallow trench is exposed. A part of the mask layer and pad oxide layer is removed to enlarge the first opening, so that a second opening, which exposes a part of the substrate, is formed. A doped region is formed on the exposed part of the substrate, while the second opening and the shallow trench are filled with a second insulating layer. Finally, the mask layer and the pad oxide layer are removed in sequence to complete the manufacture of the STI.

17 Claims, 3 Drawing Sheets

METHOD OF FABRICATING STI

BACKGROUND OF THE INVENTION

1. Field of Invention

The present invention relates to a fabrication method for a semiconductor device. More particularly, the present invention relates to a method for fabricating shallow trench isolation (STI).

2. Description of Related Art

A complete circuit, such as an integrated circuit (IC) is usually composed of thousands of transistors. To prevent a short circuit between two adjacent transistors, an isolation region, known as a field oxide (FOX) layer, is added as isolation between the adjacent transistors, and such isolation is achieved through a local oxidation (LOCOS) process. However, there are several shortcomings associated with the LOCOS process, including related problems produced as a result of conventional stress, formation of a bird's beak around the LOCOS field isolation structure, and so on. In particular, the problem related to formation of the bird's beak has made the LOCOS field isolation structure an ineffective isolation on a smaller device.

A common method for isolating the device involves forming a conventional STI, in which a steep shallow trench is formed in a semiconductor substrate by anisotropic etching, with a silicon nitride layer serving as a hard mask. The shallow trench is then filled with an oxide layer, followed by performing chemical mechanical polishing (CMP) to planarize the oxide layer, so as to form a STI serving as an isolation region of the device. As a result, the problem regarding the formation of the bird's beak around the LOCOS field isolation structure is improved. Therefore, this is a preferred and scaleable isolation structure in the present process technology where higher integration is demanded together with a smaller line width.

Reference is made to FIG. 1A to Fig. 1C, in which fabricating steps for a conventional STI are illustrated in schematic, cross-sectional diagrams. Referring to FIG. 1A, a substrate 100 is provided with a pad oxide layer 102 and a mask layer 104 formed thereon, wherein the pad oxide layer 102 and the mask layer 104 are patterned to form a shallow trench 106 in the substrate 100.

Referring to FIG. 1B, the shallow trench 106 is filled with an insulating layer so as to form a STI 110 before performing a densification step.

Referring to FIG. 1C, the mask layer 104 and the pad oxide layer 102 are removed in sequence, followed by cleaning with a HF solution to complete the STI process.

As the substrate 100 is cleaned with the HF solution, a top corner 114 of the STI 110 is removed to form a recess 112. The recess 112 is then filled with a conducting layer (not shown), while the top corner 114 of the STI 110 is wrapped around by the conducting layer when the conducting layer is formed subsequently on the substrate 100. This causes a parasitic transistor conduction, which leads to an irregularity in a relationship graph of drain current ($I_d$) versus gate voltage ($V_g$) from the transistor that is formed above the STI. This irregularity is a hump in the graph of $I_d$ versus $V_g$, causing an electron drift in the transistor.

To solve the above problem, an ion implantation step is conventionally performed on the exposed substrate in the shallow trench, after formation of the shallow trench, so that a doped region is formed on the exposed substrate to suppress the parasitic transistor conduction effect. A STI 210 formed as a result is shown in FIG. 2. However, an increase in the doping concentration for the substrate 200 increases the threshold voltage ($V_t$) of the subsequently formed transistor and decreases its driving current. In addition, a higher doping concentration for the substrate 200 increases the junction electric field of a source/drain (S/D) region. As a result, a larger junction leakage current is produced between a doped region 216 at the edge of the STI 210 and the S/D region. Thus, the refresh time of the DRAM is degraded.

SUMMARY OF THE INVENTION

The invention provides a fabrication method for STI. A substrate is provided with a patterned mask layer and pad oxide layer formed thereon, so that a first opening, which exposes a portion of the substrate, is formed. A shallow trench is then formed in the substrate, followed by filling the shallow trench with a first insulating layer, wherein the surface of the first insulating layer is lower than the surface of the substrate, and a portion of substrate forming the sidewall of the shallow trench is exposed. A part of the mask layer and pad oxide layer is removed to enlarge the first opening, so that a second opening, which exposes a portion of the substrate, is formed. A doped region is formed on the exposed portion of the substrate, while the second opening and the shallow trench are filled with a second insulating layer. Consequently, the mask layer and the pad oxide layer are removed in sequence to form a STI in the shallow trench.

As embodied and broadly described herein, the invention provides a localized ion implantation process for forming a doped region in the substrate with a specific angle. Also, the dopant includes boron (B) ions with a preferred implantation dose of about $2\times10^{12}$–$5\times10^{12}$ atoms/cm$^2$ and an implantation energy of about 8–10 KeV, if a NMOS is manufactured in the substrate. In contrast, the dopant includes arsenic (As) ions with a preferred implantation dose of about $2\times10^{12}$–$5\times10^{12}$ atoms/cm$^2$ and an implantation energy of about 20–30 KeV, if a PMOS is manufactured in the substrate.

Since the doped region is formed in the substrate adjacent to the top corner of the STI, the recess produced at the top corner of the STI will not be filled with a conducting layer, when the conducting layer is formed subsequently on the substrate. This prevents the parasitic transistor conduction and stops the irregular change, such as an irregular hump in the relationship graph of drain current ($I_d$) versus gate voltage ($V_g$). Furthermore, since the doped region is only formed in the substrate adjacent to the top corner of the STI, the threshold voltage, junction electric field and driving current of the transistor formed subsequently above the substrate are not influenced. Thus, the transistor has a stable electrical performance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 3A to 3E are schematic, cross-sectional diagrams illustrating the fabrication steps for a STI according to one preferred embodiment of this invention.

Figure 1A:
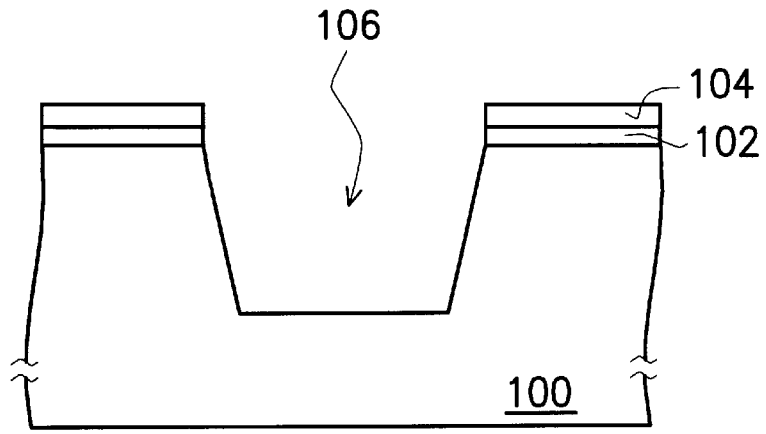
FIGS. 1A to 1C are schematic, cross-sectional diagrams illustrating the fabrication steps for a conventional STI.
Figure 1B:
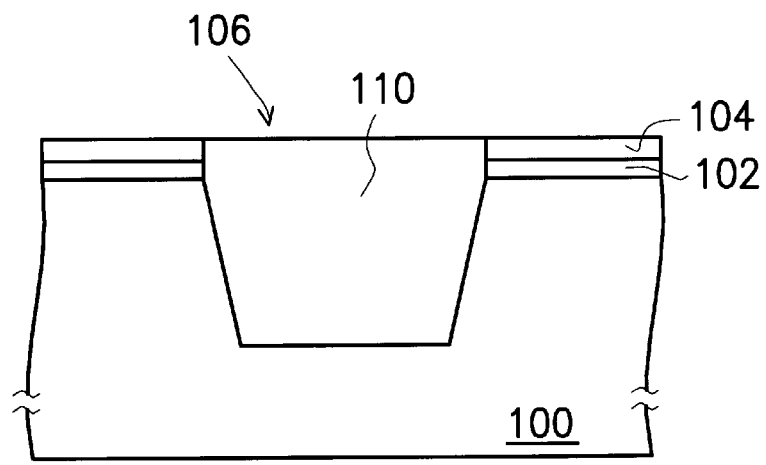
Figure 1C:
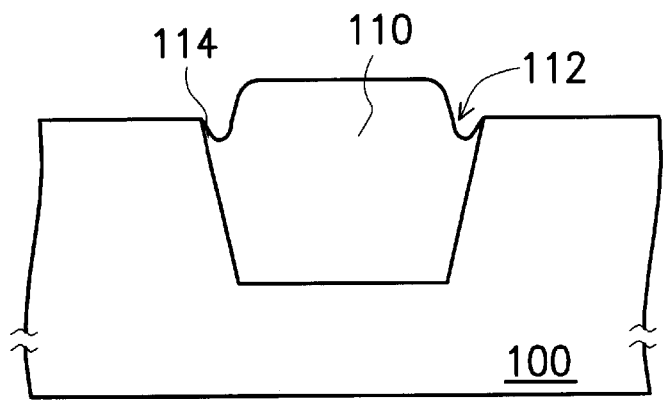
Figure 2:
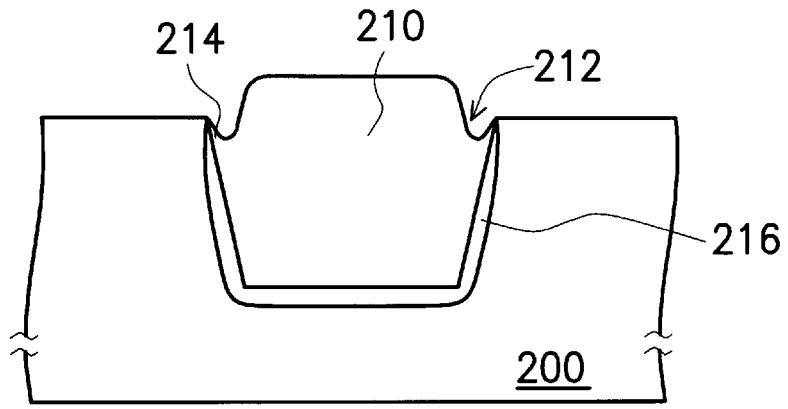
FIG. 2 is cross-sectional diagram illustrating formation of a doped region in the substrate adjacent to the edge of the STI.
Figure 3A:
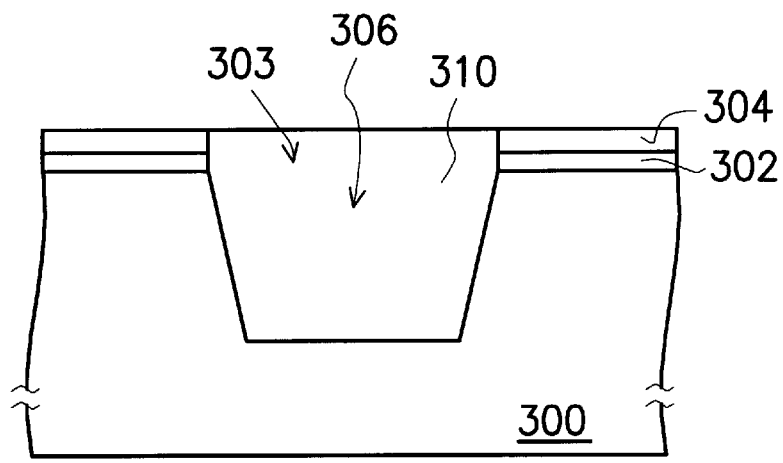
FIGS. 3A to 3E are schematic, cross-sectional diagrams illustrating the fabrication steps for a STI according to one preferred embodiment of this invention.

Referring to FIG. 3A, a substrate 300 is provided with a patterned mask layer 304 and pad oxide layer 302 formed thereon, so that an opening 303 is formed in the patterned mask layer 304 and the pad oxide layer 302 to expose a part of the substrate 300. The pad oxide layer 302 in this case serves to protect the substrate 300 from being damaged in the subsequent etching process, while the mask layer 304 may include a silicon nitride layer formed by chemical vapor deposition (CVD). With the mask layer 304 and the pad oxide layer 302 serving as a mask, a shallow trench 306 is formed in the substrate 300, followed by filling the shallow trench with an insulating layer 310. The insulating layer 310 includes a silicon oxide layer (not shown), while the method for forming the silicon oxide layer includes a process such as CVD. Preferably, the method for forming the silicon oxide layer includes sub-atmospheric chemical vapor deposition (SACVD) or high-density plasma chemical vapor deposition (HDPCVD). A chemical mechanical polishing (CMP) step is performed to remove a of the silicon oxide layer until the surface of mask layer is exposed, so that the insulating layer 310 is formed in the shallow trench 306.

Figure 3B:
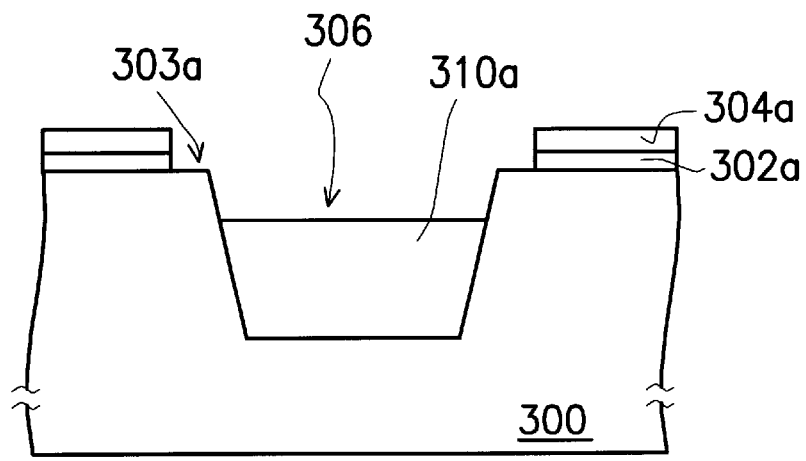

Reference is then made to FIG. 3B. A part of the insulating layer 310 in the shallow trench 306 is removed until the surface of insulating layer 310a is lower than the surface of the substrate 300, so that a part of substrate 300 forming the sidewall of the shallow trench 306 is exposed. The surface of the insulating layer 310a is spaced apart from the surface of the substrate 300 by a vertical distance of about 500 angstroms, wherein the method for removing the insulating layer 310 includes etch back. A part of the mask layer 304 and pad oxide layer 302 are then removed in sequence to enlarge the opening 303 to form a bigger opening 303a, indicating an etching back of the mask layer and the pad oxide layer from the sidewall of the shallow trench 306. This exposes a part of the surface of the substrate 300, while the sidewall of the opening 303a is spaced apart from the sidewall of the shallow trench 306 by a horizontal distance of about 200–300 angstroms.

Figure 3C:
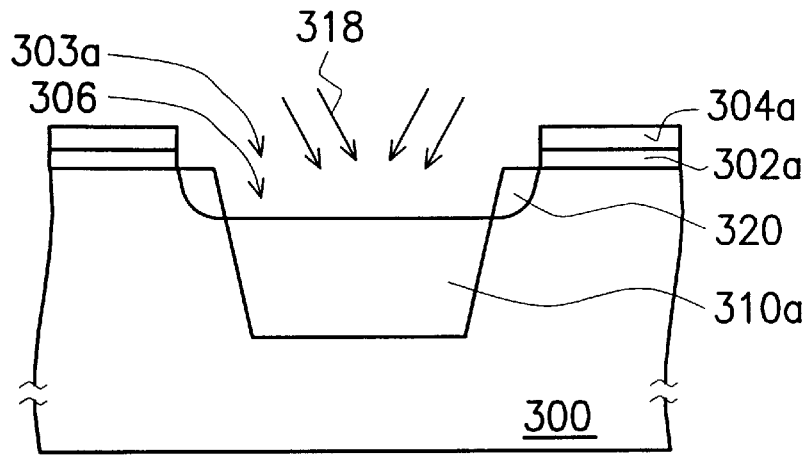

Referring to FIG. 3C, a doped region 320 is formed by performing a localized ion implantation step 318, where ions are doped by self-alignment with a specific angle in the exposed substrate 300. The dopant in this case includes boron (B) ions with a preferred implantation dose of about $2 \times 10^{12}$–$5 \times 10^{12}$ atoms/cm$^2$ and an implantation energy of about 8–10 KeV, if a NMOS is manufactured in the substrate. In contrast, the dopant includes arsenic (As) ions with a preferred implantation dose of about $2 \times 10^{12}$–$5 \times 10^{12}$ atoms/cm$^2$ and an implantation energy of about 20–30 KeV, if a PMOS is manufactured in the substrate.

Accordingly, it is understood that the localized ion implantation step 318 is performed to form the doped region 320 by self-alignment at the top corner of the shallow trench 306, so formation of a parasitic transistor at the top corner of the shallow trench is inhibited. Furthermore, since the doped region 320 is formed by the localized ion implantation step 318, the threshold voltage, junction electric field, and driving current of the transistor formed subsequently above the substrate 300 are not influenced. So, the transistor has a stable electrical performance.

Figure 3D:
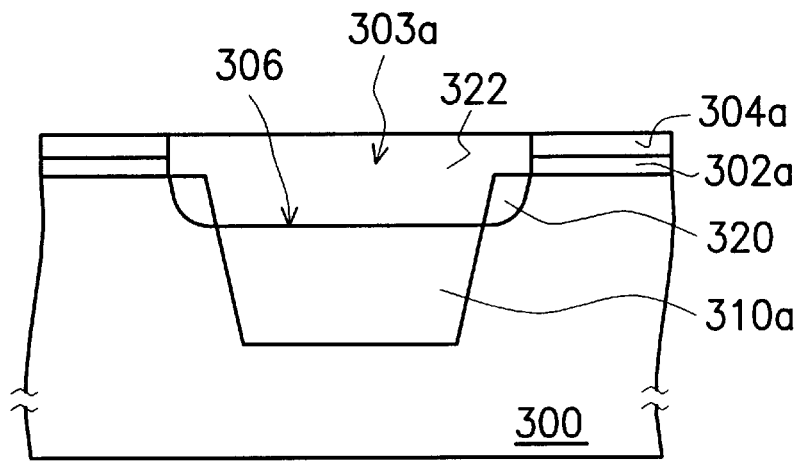

Referring to FIG. 3D, an insulating layer (not shown) is formed on the substrate 300, followed by removing a part of the insulating layer until the surface of the mask layer 304a is exposed. As a result, the insulating layer 322 is formed to fill the shallow trench 306 and the opening 303a, wherein the insulating layer 322 includes a silicon oxide layer. A densification step is performed, wherein the densification step involves a temperature of about 1000° C. and duration of about 10–30 minutes to increase the density of the material for subsequently forming the STI. This prevents ions from penetrating the STI during subsequent ion implantation, as the ion penetration would cause problems such as a current leakage and a short circuit in the device.

Figure 3E:
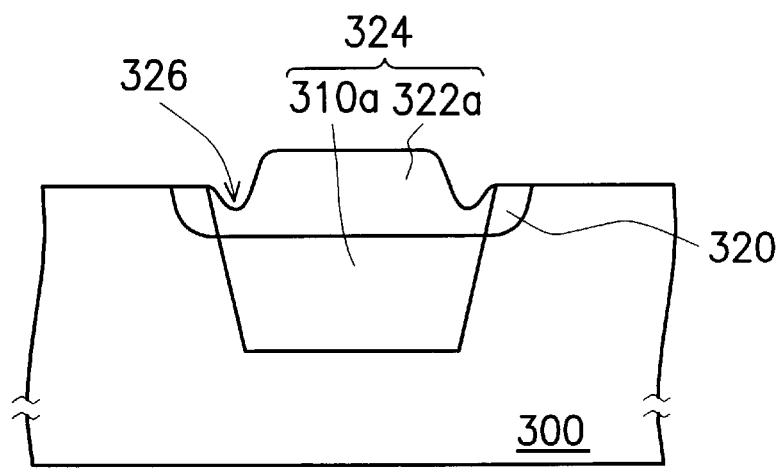

Referring to FIG. 3E, the mask layer 304a and the pad oxide layer 302a are removed in sequence. As the pad oxide layer 302a and the insulating layer 322 have similar etching rates, a part of the insulating layer 322 is removed by a process, such as wet etching or dry etching to form the insulating layer 322a during removal of the pad oxide layer 302a. Therefore, a STI 324 consisting of the insulating layers 310a and 322a is formed in the shallow trench 306. A cleaning step is then performed to complete manufacture of the STI 324, wherein the cleaning step involves cleaning the substrate 300 with a HF solution. When the substrate 300 is cleaned with the HF solution, the top corner of the shallow trench 326 is removed to form a recess 326.

Since the doped region 320 is formed in the exposed substrate adjacent to the top corner of the STI 324, the parasitic transistor conduction is prevented when a conducting layer is formed on the substrate 300 for filling the recess 326. This stops the irregular change, such as an irregular hump in the relationship graph of drain current ($I_d$) versus gate voltage ($V_g$). In addition, the doped region is only formed in the substrate adjacent to the top corner of the STI, so the threshold voltage, junction electric field and driving current of the transistor formed subsequently above the substrate are not influenced. Thus, the transistor has a stable electrical performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a shallow trench isolation (STI), the method comprising steps of:

providing a substrate with a patterned mask layer and pad oxide layer formed thereon, so that a first opening which exposes a part of the substrate is formed;

forming a shallow trench in the substrate, with the mask layer and the pad oxide layer serving as a mask;

forming a first insulating layer in the shallow trench, wherein a surface of the first insulating layer is lower than a surface of the substrate, and a part of the substrate forming a sidewall of the shallow trench is exposed;

removing a part of the mask layer and the pad oxide layer, so that the first opening is enlarged to form a second opening which exposes a part of the substrate;

forming a doped region in the exposed part of the substrate;

forming a second insulating layer which fills the shallow trench and the second opening; and removing the mask layer and the pad oxide layer in sequence so as to form a STI in the shallow trench.

2. The fabrication method of claim 1, wherein the step of forming the doped region involves implanting a dopant into the exposed part of the substrate by localized ion implantation with a specific angle.

3. The fabrication method of claim 2, wherein the dopant includes boron (B) ions with a preferred implantation dose of about $2 \times 10^{12}$–$5 \times 10^{12}$ atoms/cm$^2$ and an implantation energy of about 8–10 KeV, if a NMOS is manufactured in the substrate.

4. The fabrication method of claim 2, wherein the dopant includes arsenic (As) ions with a preferred implantation dose of about $2 \times 10^{12}$–$5 \times 10^{12}$ atoms/cm$^2$ and an implantation energy of about 20–30 KeV, if a PMOS is manufactured in the substrate.

5. The fabrication method of claim 1, wherein the surface of the first insulating layer is spaced apart from the surface of the substrate by a vertical distance of about 500 angstroms.

6. The fabrication method of claim 1, wherein a sidewall of the second opening is spaced apart from the sidewall of the shallow trench by a horizontal distance of about 200–300 angstroms.

7. The fabrication method of claim 1, wherein forming the first insulating layer comprises steps of:

forming an insulating layer on the substrate;

performing CMP for removing a part of the insulating layer until a surface of the mask layer is exposed;

performing an etch back to remove a part of the insulating layer so as to form the first insulating layer in the shallow trench.

8. The fabrication method of claim 1, further comprising performing a densification step after formation of the second insulating layer.

9. The fabrication method of claim 8, wherein condition for the densification step include a temperature of about 1000° C. and a process duration of about 10–30 minutes.

10. A fabrication method for a STI, wherein a substrate is provided with a patterned mask layer and pad oxide layer formed thereon, with a first opening which exposes a part of the substrate, the method comprising steps of:

forming a shallow trench in the substrate, with the mask layer and the pad oxide layer serving as a mask;

forming a silicon oxide layer on the substrate to fill the shallow trench;

performing CMP, so that a part of the silicon oxide layer is removed until the surface of the mask layer is exposed;

removing another part of the silicon oxide layer, so that a surface of the remaining silicon oxide layer is lower than a surface of the substrate, and a part of the substrate forming a sidewall of the shallow trench is exposed;

removing a part of the mask layer and the pad oxide layer, so that the first opening is enlarged to form a second opening which exposes a part of the substrate;

performing a local ion implantation, so that a doped region is formed on an exposed part of the substrate;

forming an insulating layer which fills the shallow trench and the second opening;

performing a densification step; and removing the mask layer and the pad oxide layer in sequence so as to form a STI in the shallow trench.

11. The fabrication method of claim 10, wherein the localized ion implantation involves implanting a dopant with a specific angle into the exposed part of the substrate.

12. The fabrication method of claim 11, wherein the dopant includes B ions with a preferred implantation dose of about $2 \times 10^{12}$–$5 \times 10^{12}$ atoms/cm$^2$ and an implantation energy of about 8–10 KeV, if a NMOS is manufactured in the substrate.

13. The fabrication method of claim 11, wherein the dopant includes As ions with a preferred implantation dose of about $2 \times 10^{12}$–$5 \times 10^{12}$ atoms/cm$^2$ and an implantation energy of about 20–30 KeV, if a PMOS is manufactured in the substrate.

14. The fabrication method of claim 10, wherein the surface of the first insulating layer is spaced apart from the surface of the substrate by a vertical distance of about 500 angstroms.

15. The fabrication method of claim 10, wherein the sidewall of the second opening is spaced apart from the sidewall of the shallow trench by a horizontal distance of about 200–300 angstroms.

16. The fabrication method of claim 10, wherein the step for removing a part of the silicon oxide layer includes etching back.

17. The fabrication method of claim 8, wherein conditions for the densification step include a temperature of about 1000° C. and a process duration of about 10–30 minutes.

* * * * *